United States Patent
Brani et al.

[11] Patent Number: 5,926,059
[45] Date of Patent: Jul. 20, 1999

[54] STACKED CHARGE PUMP CIRCUIT

[75] Inventors: Francesco M. Brani; Mauro Luigi Sali; Marco Dallabora, all of Milan, Italy

[73] Assignee: SGS-Thomson Microelectronics S.r.l., Agrate Brianza, Italy

[21] Appl. No.: 08/927,391

[22] Filed: Aug. 27, 1997

[51] Int. Cl.⁶ ................................................. H01J 19/82
[52] U.S. Cl. ......................... 327/536; 327/537; 327/589; 363/60; 307/110
[58] Field of Search .................................... 327/390, 589, 327/536, 537, 535; 307/35, 110; 363/59, 60

[56]            References Cited
          U.S. PATENT DOCUMENTS

| | | | |
|---|---|---|---|
| 5,126,808 | 6/1992 | Montalvo et al. | 357/23.5 |
| 5,140,182 | 8/1992 | Ichimura | 307/296.1 |
| 5,589,793 | 12/1996 | Kassapian | 327/536 |

OTHER PUBLICATIONS

John F. Dickson, "On–Chip High–Voltage Generation in MNOS Integrated Circuits Using an Improved Voltage Multiplier Technique", IEEE Journal of Solid–State Circuits, vol. SC–11, No. 3, (Jun. 1976), pp. 374–378.

*Primary Examiner*—Kenneth B. Wells
*Assistant Examiner*—Minh Nguyen
*Attorney, Agent, or Firm*—Allen, Dyer, Doppelt, Milbrath & Gilchrist, P.A.

[57]           ABSTRACT

The invention relates to a voltage multiplier such as a charge pump circuit. The circuit is realized by a plurality of cascade connected voltage gain stages, each stage comprising a first and a second cell each receiving a pair of clock phase signals and comprising a pair of MOS transistors having first and second conduction terminals and a control terminal. These transistors have their first conduction terminals connected together and to a voltage reference; while the control terminals of each transistor are connected to the second conduction terminal of the other transistor of the same cell. Moreover, the second conduction terminal of the first transistor receives a first phase signal via a first coupling capacitor, and the second conduction terminal of the second transistor receives a second phase signals via a first pumping capacitor. Third and fourth cells are provided having the same structure as the first and the second cell. The third cell is coupled to the first cell by a series connection between their corresponding coupling capacitors and their corresponding pumping capacitors, respectively. The fourth cell is coupled to the second cell by a series connection between their corresponding coupling capacitors and by their corresponding pumping capacitors, respectively.

17 Claims, 4 Drawing Sheets

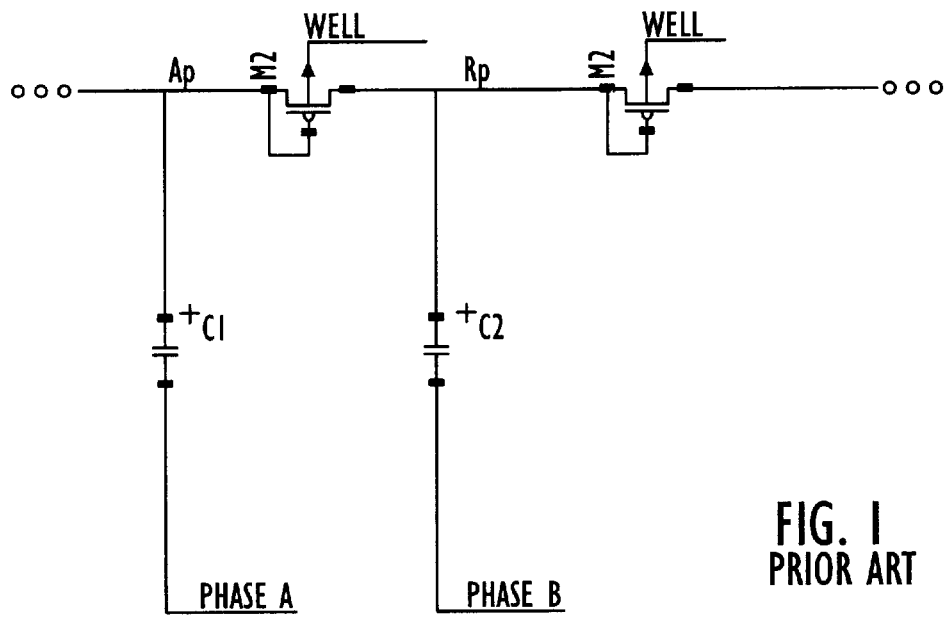
FIG. 1
PRIOR ART
FIG. 2A
PRIOR ART
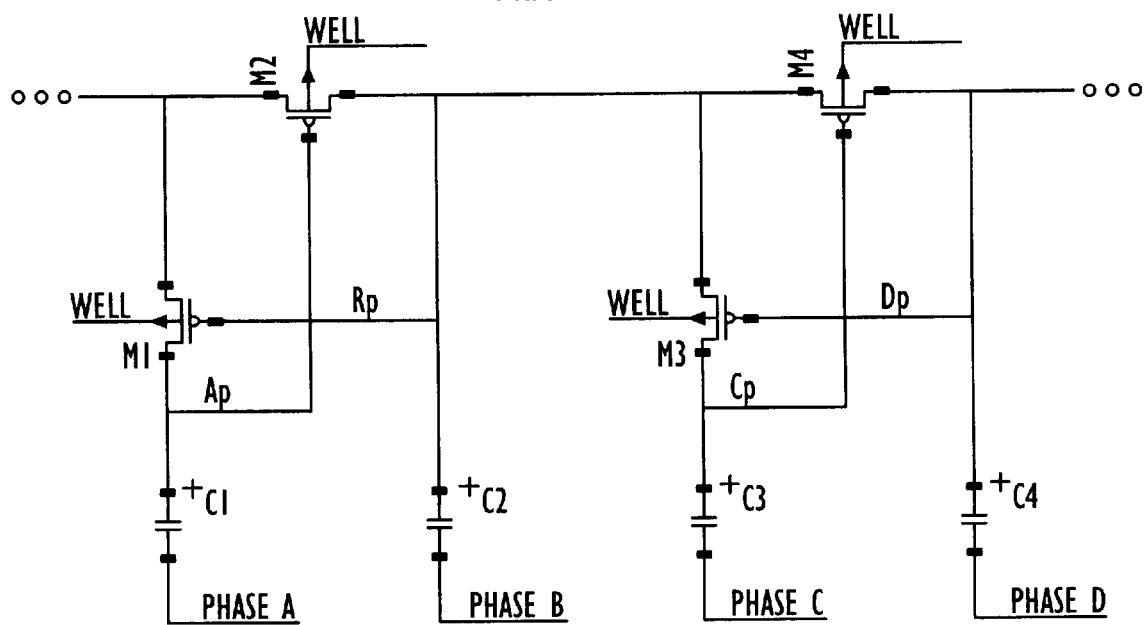

STACKED CHARGE PUMP CIRCUIT

FIELD OF THE INVENTION

The present invention relates to a stacked charge pump circuit. More specifically, the invention relates to a stacked charge pump circuit for semiconductor integrated memory devices such as non-volatile Flash EEPROM using a single main power supply.

BACKGROUND OF THE INVENTION

As is well known, electronic memory devices using a single power supply, such as Flash Electrically Erasable Programmable Read-Only Memories (EEPROMs) having a 3 Volt main power supply, require positive voltages higher that the main power supply for the reading, writing and erasing phases and negative voltages less than the ground voltage reference for the reading and erasing phases. Voltage multipliers or charge pump circuits are widely used in these semiconductor electronic devices to internally generate voltage supplies with values higher or less than a main power supply. Many prior art approaches use charge pump circuits to provide the above required voltage values.

One such approach is disclosed in an article reported on the IEEE Journal of Solid State Circuits, Vol. SC-11, No. 3, June 1976. This approach relates to a voltage multiplier circuit using MOS technology as shown in FIG. 1. A multiplier chain is implemented using diode-connected P-channel MOS transistors. The nodes of the diode chain are coupled to the circuit inputs via capacitors in parallel. FIG. 1 shows just a portion of the diode chain including two transistors M1, M2 and two coupling capacitors C1, C2. Two non-overlapping clock pulses Phase A and Phase B are capacitively coupled to the transistors gates. The clocks are generated by two cascade MOS inverters driven by an oscillator circuit.

The multiplier operates by pumping packets of charge along the diode chain as the coupling capacitors are successively charged and discharged during each half of the clock cycle. The circuit portion shown in FIG. 1 may be considered as a single stage and a number of multiplier stages may be connected between the circuit inputs and outputs.

This first kind of charge pump circuit is also known as a two phase diode architecture parallel charge pump and presents some advantages since the maximum voltage applied to a pump capacitor is given by the absolute value of the minimum voltage which is present inside the pump circuit. The current drive capability is also independent from the number of multiplier stages. For instance, if we consider an—stage pump with a single positive main voltage supply Vdd and a ground reference, the output voltage would be:

Vout=-(N * (Vdd-Vtp)-Vtp)

where Vtp is the absolute value of the P-Channel MOS threshold voltage. The maximum voltage drop Vs on last coupling capacitor, the one closer to the output load, is given by:

Vs=N * (Vdd-Vtp)=N times the single stage voltage gain.

Notwithstanding these advantages over other previous techniques, this known charge pump requires the integration of high value capacitors which occupy a large integrated circuit area.

A second approach is disclosed in U.S. Pat. No. 5,126,808 to Montalvo which relates to Flash EEPROM array architecture including a four phase parallel charge pump circuit. FIG. 2 shows a simplified schematic diagram of a negative charge pump circuit according to this second prior art approach. FIG. 2A shows a couple of stages of the FIG. 2 charge pump.

This multiplier chain is implemented using P-Channel MOS transistors. Each stage includes several transistors connected together and having their respective gate terminals connected to a corresponding coupling capacitor. FIG. 2A shows a first stage including transistors M1 and M2 coupled to corresponding capacitors C1, C2 and a subsequent stage including transistors M3, M4 coupled to corresponding capacitors C3, C4. The capacitor C1 is much smaller than the other capacitor C2 (C1<<C2). The same applies for the capacitor C3 which is much smaller than the other capacitor C4 (C3<<C4). Four clock pulses Phase A, Phase B, Phase C and Phase D are capacitively coupled to the transistor gates of the stages via the capacitors C1, C2, C3 and C4.

Every stage gains a voltage equal to the main supply voltage Vdd. If we consider a pump circuit including N stages and a capacitive load, the final multiplied voltage is:

Vout-(N* Vdd-Vtp)

The maximum voltage drop Vs on last coupling capacitor, the one closer to the output load, is given by:

Vs=N * Vdd=N times the single stage voltage gain

Therefore, even with this second approach the voltage drop on the coupling capacitor is relatively high and generally requires substituting each capacitor with the series of two capacitors having doubled capacitance to improve the reliability of the circuit, but increasing the integrated circuit area.

A third prior art approach is known as Cockcroft-Walton voltage multiplier and is disclosed again in the article reported in the IEEE Journal of Solid State Circuits, Vol. SC-11, No. 3, June 1976. This approach is also known as a two phase diode architecture stacked charge pump and requires coupling discrete capacitors C which are connected serially and are much greater than stray capacitors Cs, as shown in FIG. 3.

The final multiplied voltage of N stages is:

Vout=-(N*(Vdd-Vtp)-Vtp)

The maximum voltage drop Vs on a coupling capacitor is given by:

Vs=2 * (Vdd-Vtp)=2 times the single stage voltage gain.

Unfortunately, this type of multiplier is not adequate for integration in monolithic form since it requires high value capacitances.

SUMMARY OF THE INVENTION

In view of the foregoing background, one object of the invention is that of providing a new voltage multiplier circuit of the charge pump type having such structural and functional features overcoming the limits and drawbacks of the above charge pump circuits of the prior art.

Another object of the present invention is that of providing a charge pump circuit having a reduced integrated circuit area.

A further object of the present invention is that of providing a charge pump circuit for non-volatile memory devices that imposes no limits on the voltage applied to the coupling capacitors.

A further object of the present invention is that of providing a charge pump circuit being supplied by a single positive main power supply and by a single ground reference.

The invention is based upon realizing a four phase and erasing threshold stacked charge pump architecture. Accordingly the technical problems are solved by a stacked charge pump circuit comprising a plurality of cascade connected voltage gain stages, and with each stage comprising a first and a second cell each receiving a pair of clock phase signals. Each cell comprises a pair of MOS transistors each having first and second conduction terminals and a control terminal. The transistors have their first conduction terminals connected together and to a voltage reference, and the control terminal of each transistor is connected to the second conduction terminal of the other transistor of the same cell. The second conduction terminal of the first transistor receives a first phase signal via a first coupling capacitor. The second conduction terminal of the second transistor receives a second phase signals via a first pumping capacitor.

The charge pump circuit also includes a third and fourth cell having the same structure as the first and second cell. The third cell is coupled to the first cell by a series connection between their corresponding coupling capacitors and by a series connection between their corresponding pumping capacitors. The fourth cell is coupled to the second cell by a series connection between their corresponding coupling capacitors and by a series connection between their corresponding pumping capacitors.

The features and advantages of the charge pump circuit according to the invention will be appreciated by the following description of a preferred embodiment given by way of non-limiting example with reference to the annexed drawings.

BRIEF DESCRIPTION OF THE DRAWINGS

FIG. 1 shows a schematic diagram of a single stage of a charge pump circuit according to the prior art;

FIG. 2A shows a couple of stages of the FIG. 2 charge pump;

DETAILED DESCRIPTION OF THE PREFERRED EMBODIMENTS

Figure 2:
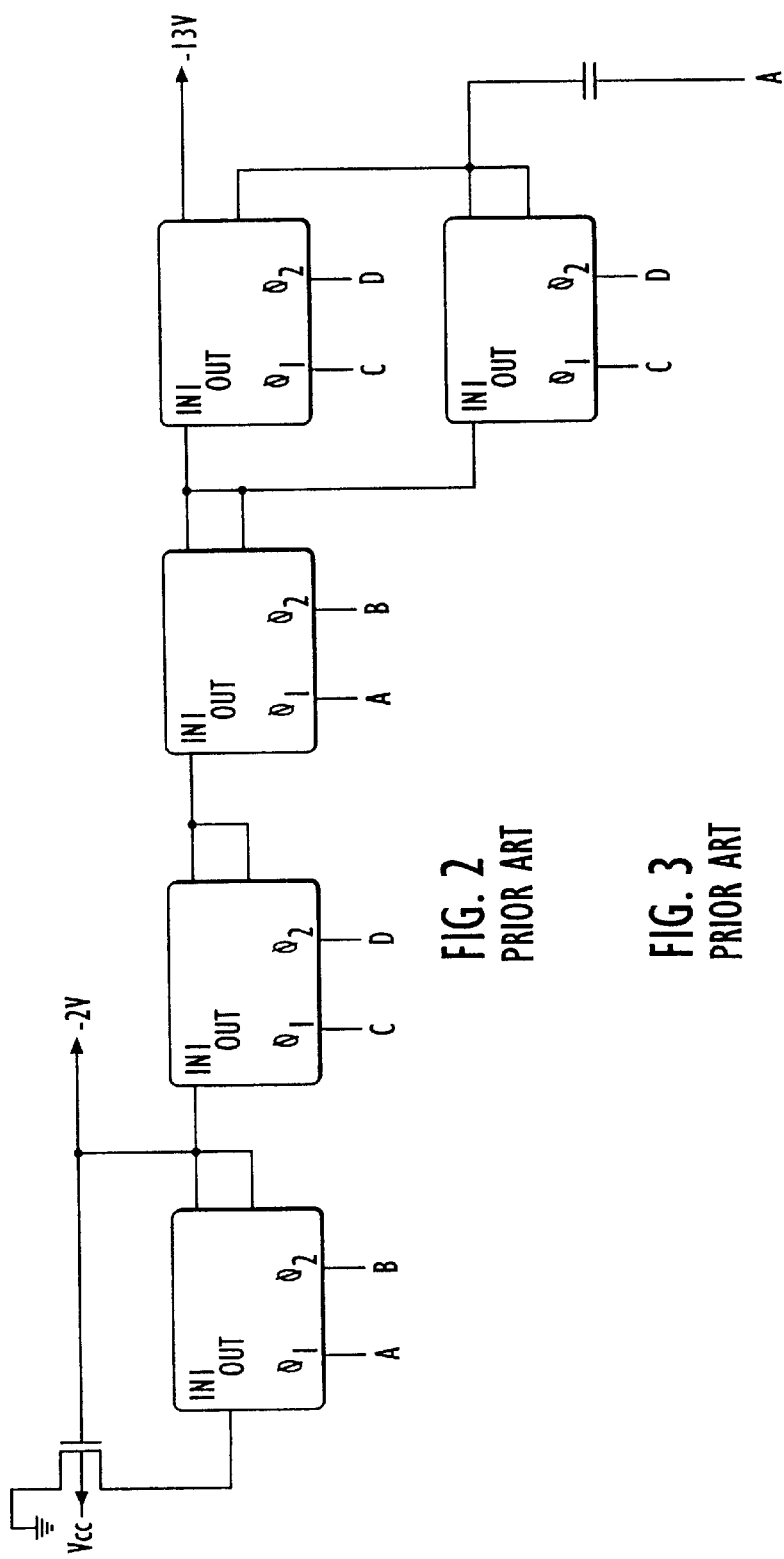
FIG. 2 shows a simplified schematic diagram of a charge pump circuit according to a second prior art solution.
Figure 3:
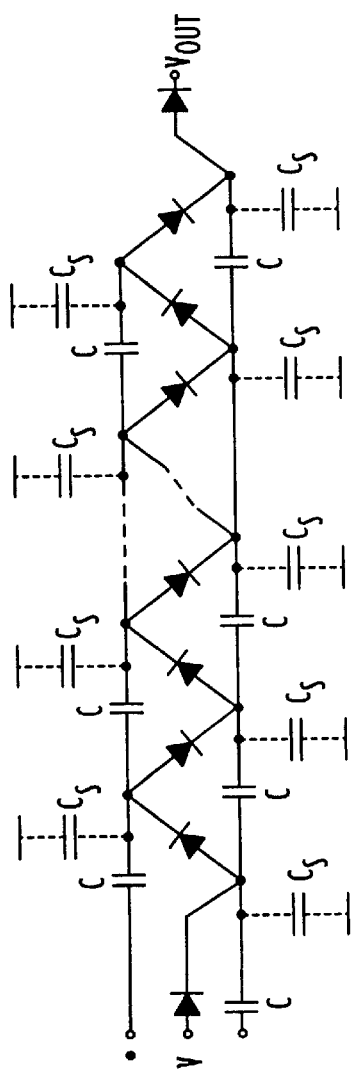
FIG. 3 shows a schematic diagram of a known basic Cockcroft-Walton voltage multiplier.
Figure 4:
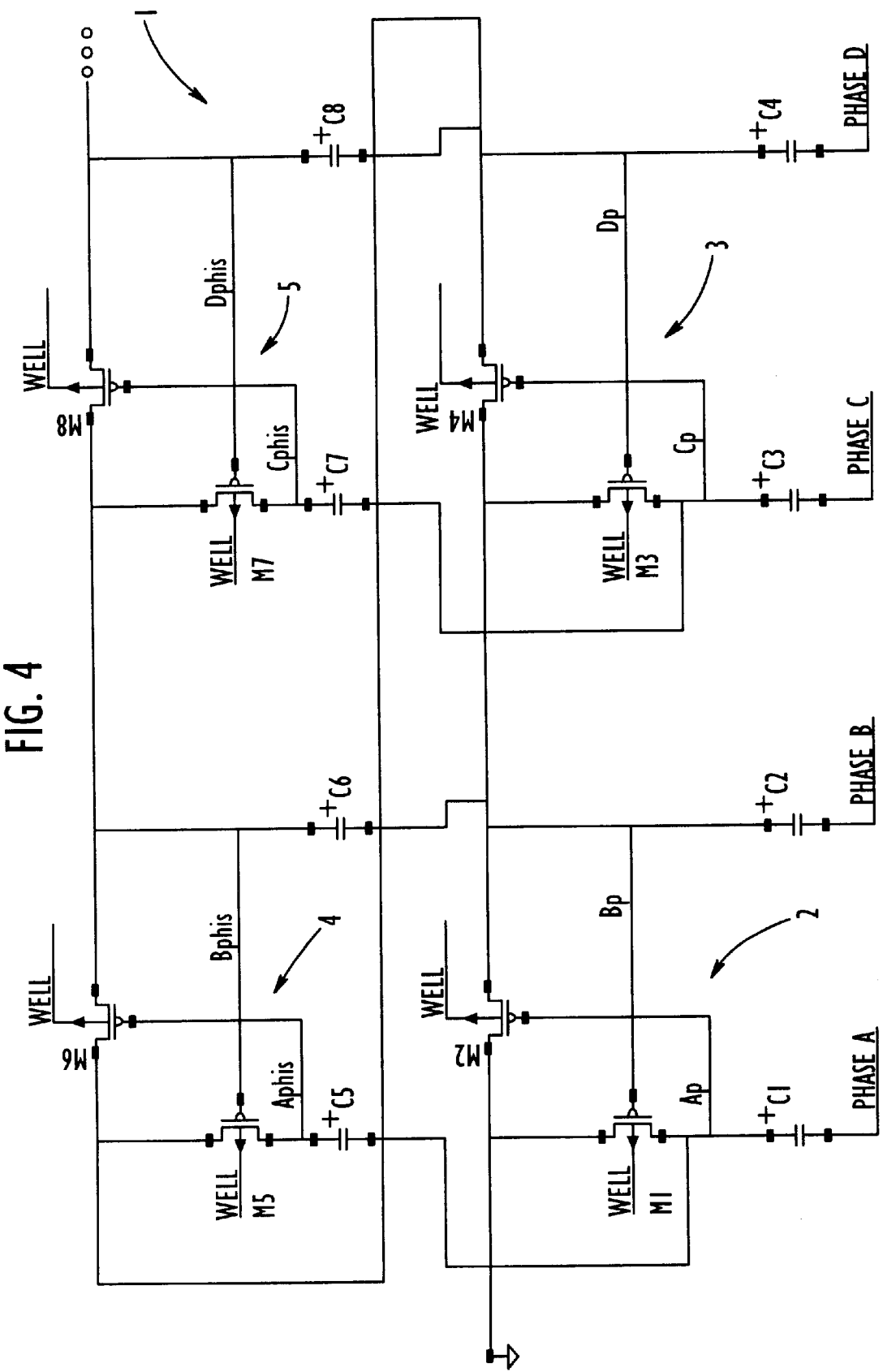
FIG. 4 is a schematic diagram of a single stage of a charge pump circuit according to the principle of the present invention.

With reference to the above figures, and more specifically to the embodiment of FIG. 4, reference numeral 1 is globally used to indicate a four phase voltage gain stage for a charge pump circuit according to the present invention. We will firstly disclose a negative charge pump, extending after the principle of the invention to the implementation of a positive charge pump circuit. The stage 1 includes a plurality of MOS transistors and a plurality of coupling and pumping capacitors.

The stage 1 presents a modular structure including a plurality of cells having substantially the same structure. Each stage comprises four cells which correspond to the number of clock phase signals applied to each stage.

A first cell 2 comprises a pair of P-channel MOS transistors M1 and M2 each having a first and a second conduction terminal and a control terminal. These transistors M1, M2 have their first conduction terminals connected together and to a voltage reference which, in this specific example of a negative charge pump, is a ground reference. The control terminal of each transistor is connected to the second conduction terminal of the other transistor of the cell.

A phase signal A is applied to the second conduction terminal of the first transistor M1 via a first coupling capacitor C1. A second phase signal B is applied to the second conduction terminal of the second transistor M2 via a second capacitor C2 which will be named the pumping capacitor in the following description. Therefore, a first phase signal Ap is applied to the control terminal of the second transistor M2, while a second phase signal Bp is applied to the control terminal of the first transistor M1. The capacitance value of the first coupling capacitor C1 is much smaller than the capacitance value of the second pumping capacitor C2 (C1<<C2).

Advantageously, according to the invention, a second cell 3 of the stage 1 is provided in connection with the first cell 2. This second cell 3 includes a first M3 and a second M4 P-channel MOS transistor which are connected together in the same manner in which the transistors M1 and M2 of the first cell 2 are connected. These transistors M3, M4 of this second cell 3 have their first conduction terminals connected together and to the second conduction terminal of the second transistor M2 of the first cell 2. A third phase signal C is applied to the second conduction terminal of the first transistor M3 of the second cell 3 via a capacitor C3. A fourth phase signal D is applied to the second conduction terminal of the second transistor M4 of the second cell 3 via a further capacitor C4. Therefore, a third phase signal Cp is applied to the control terminal of this second transistor M4, while a fourth phase signal Dp is applied to the control terminal of the first transistor M3. The capacitance value of the first capacitor C3 of the second cell 3 is much smaller than the capacitance value of the other second capacitor C4 (C3<<C4).

Two other cells 4 and 5 are provided in the stage 1. The third cell 4 is coupled to the first cell 2 and comprises two P-channel MOS transistors M5, M6 and two capacitors C5 and C6. The four components M5, M6, C5, C6 of this third cell 4 are connected together as the other components of the previously disclosed first and second cells 2 and 3. The transistors M5 and M6 of this third cell 4 have their first conduction terminals connected together and to the second conduction terminal of the second transistor M4 of the second cell 3. The third cell 4 is coupled to the first cell 2 since its first capacitor C5 is connected between the second conduction terminal of its first transistor M5 and the second-conduction terminal of the first transistor M1 of the first cell 2. Similarly, the second capacitor C6 of the third cell 4 is connected between the second conduction terminal of the second transistor M6 of the third cell 4 and the second conduction terminal of the second transistor M1 of the first cell 2.

As for the other cells, even for this third cell 4 the capacitance of the first capacitor C5 is much smaller than the capacitance of the second capacitor C6 (C5<<C6).

The fourth cell 5 is coupled to the second cell 3 and comprises two P-channel MOS transistors M7, M8 and two capacitors C7 and C8. The four components M7, M8, C7, C8 of this fourth cell 5 are connected together as the other components of the previously disclosed first, second and third cells 2, 3 and 4.

The transistors M7 and M8 of this fourth cell 5 have their first conduction terminals connected together and to the second conduction terminal of the second transistor M6 of the third cell 4. The fourth cell 5 is coupled to the second cell 3 since its first capacitor C7 is connected between the second conduction terminal of its first transistor M7 and the second conduction terminal of the first transistor M3 of the second cell 3. Similarly, the second capacitor C8 of the fourth cell 5 is connected between the second conduction terminal of the second transistor M8 of the fourth cell 5 and the second conduction terminal of the second transistor M4 of the second cell 3.

As for the other cells, even for this fourth cell 5 the capacitance of the first capacitor C7 is much smaller than the capacitance of the second capacitor C8 (C7<<C8).

It's important to note that the capacitors C1 and C5 are effectively serially connected so that the phase signal Ap is substantially duplicated on the control terminal of the second transistor M6 of the third cell 4. Other series connections are established between the capacitors C2 and C6; C3 and C7; C4 and C8. The higher value capacitors will be identified in the following description as the pumping capacitors.

Figure 5:
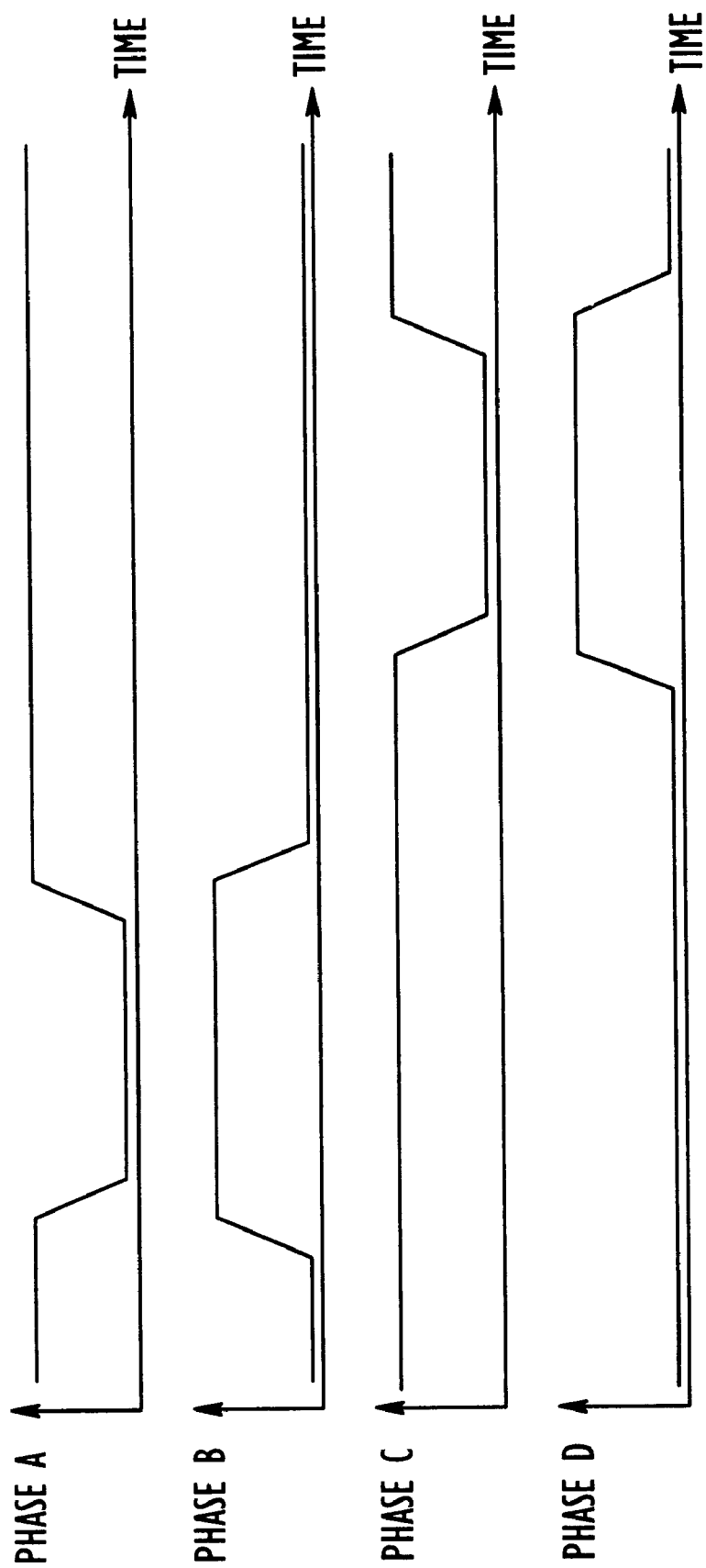
FIG. 5 is a plot of voltage values versus time of the four phase signals applied to each stage of the charge pump circuit according to the invention.

Let's now take in consideration the operation of the voltage gain stage 1 according to the invention. The four phase signals A, B, C and D oscillate between the ground voltage reference and the main power supply voltage value Vdd. How the four phases evolve versus time is shown in FIG. 5.

If the output of the charge pump circuit is connected to a pure capacitive load, each stage has a voltage gain Vg equal to the main voltage supply_Vdd. On the contrary, if the output of the charge pump circuit is connected to a resistive load, each stage 1 gains a voltage Vg which is given by Vdd−Z*I, where Z is the stage impedance and I is the current produced by the pump circuit. The impedance Z may be computed by the following relation:

$Z=N/(2*f*C)$ where f is the oscillation frequency of the four phases and C is the capacitance of the pumping capacitors C2, C4, C6 and C8.

If we consider a charge pump circuit including N stages 11 the output voltage Vout of the circuit connected to a capacitive load would be:

Vout=−(N*Vdd−Vtp)

which is independent from the number of pumping stages cascade connected.

The maximum voltage drop Vs on a pumping capacitor is given by the following relation:

Vs=2*Vdd=2 times the single stage voltage gain.

The following comparison table compares the performances of the charge pump circuit according to the invention to those of the prior art circuits. Those skilled in the art may appreciate that the circuit according to the invention provides the better performances in terms of single stage gain and maximum voltage applied to a pumping capacitor.

COMPARISON TABLE

| Architecture | two phases in parallel | four phases in parallel | two phases stacked | four phases stacked |
| --- | --- | --- | --- | --- |
| Single stage gain | Vdd−Vtp | Vdd | Vdd−Vtp | Vdd |
| Max. voltage applied to a capacitor | N*Vg | N*Vg | 2*Vg | 2*Vg |

The circuit architecture according to the invention may be considered an "erasing threshold" structure since the single stage gain corresponds to the main power supply Vdd and it's not reduced by a P-channel threshold voltage drop. The maximum voltage applied to the pumping capacitors is independent from the number N of stages forming the charge pump circuit.

As previously mentioned with reference to prior art, in known four phase circuits with a parallel charge pump architecture the pumping capacitors are substituted by a series of two, three or more capacitors having a double, triple or multiple capacitance thereby increasing the integrated circuit area. This is not required with the stacked four phase charge pump circuit according to the invention.

The skilled in the art may appreciate that the principle of the invention may be applied to a positive charge pump circuit including N-Channel MOS transistors. In such a case, the circuit structure shown in FIG. 4 may be changed to include all N-channel MOS transistor and the first conduction terminals of both transistors of the first cell must be connected to the main power supply voltage reference Vdd. Such a dual configuration must be supplied by phase signals which are inverted if compared with those of the previously disclosed embodiment and a positive output voltage higher that the main power supply Vdd may be obtained.

We claim:

1. A stacked charge pump circuit comprising:

a plurality of cascade connected voltage gain stages, each voltage gain stage comprising:
a first cell receiving first and second clock phase signals and a second cell receiving third and fourth clock phase signals, each of the first and second cells comprising
first and second MOS transistors each having first and second conduction terminals and a control terminal, said first and second MOS transistors having first conduction terminals connected together, said first and second MOS transistors of the first cell having the first conduction terminals further being connected to a voltage reference, each of the first and second MOS transistors having the control terminal thereof connected to the second conduction terminal of the other transistor of the same cell,
a coupling capacitor connected to the second conduction terminal of the first MOS transistor, the coupling capacitor receiving a respective clock phase signal, and
a pumping capacitor connected to the second conduction terminal of the second MOS transistor, the pumping capacitor receiving a respective clock phase signal; and
third and fourth cells each having the same structure as the first and second cells, the third cell being coupled to the first cell by a series connection between corresponding first coupling capacitors and by a series connection between corresponding first pumping capacitors, the fourth cell being coupled to the second cell by a series connection between corresponding coupling capacitors and by a series connection between corresponding pumping capacitors, the second-cell being coupled to the third call by a connection between the second conduction termninal of the sacond MOS transistor of the second cell and the first conduction terminals of the first and second MOS transistors of the third cell, and the second cell being coupled to the first cell by a connection of the first conduction terminals of the first and second MOS transistors of the second cell to the second conduction terminal of the second MOS transistor of the first cell.

2. A charge pump circuit according to claim 1, wherein said first and second MOS transistors are P-channel MOS transistors and the first conduction terminals thereof for the first cell are connected to a ground voltage reference.

3. A charge pump circuit according to claim 1, wherein said first and second MOS transistors are N-channel MOS transistors and the first conduction terminals thereof for the first cell are connected to a main power supply voltage reference.

4. A charge pump circuit according to claim 1, wherein the coupling capacitor of each cell has a smaller capacitance than the pumping capacitor of the same cell.

5. A charge pump circuit according to claim 3, wherein said main power supply is positive voltage.

6. A voltage gain stage comprising:

a first cell receiving first and second clock phase signals and a second cell receiving third and fourth clock phase signals, each of the first and second cells comprising
first and second transistors each having first and second conduction terminals and a control terminal, said first and second transistors having first conduction terminals connected together, said first and second transistors of the first cell having the first conduction terminals further being connected to a voltage reference, each of the first and second transistors having the control terminal thereof connected to the second conduction terminal of the other transistor of the same cell,
a coupling capacitor connected to the second conduction terminal of the first transistor, the coupling capacitor receiving a respective clock phase signal, and
a pumping capacitor connected to the second conduction terminal of the second transistor, the pumping capacitor receiving a respective clock phase signal; and third and fourth cells each having the same structure as the first and second cells, the third cell being coupled to the first cell by a series connection between corresponding first coupling capacitors and by a series connection between corresponding first pumping capacitors, the fourth cell being coupled to the second cell by a series connection between corresponding coupling capacitors and by a series connection between corresponding pumping capacitors, the second cell being coupled to the third cell by a connection between the second conduction terminal of the second transistor of the second cell and the first conduction terminals of the first and second transistors of the third cell, and the second cell being coupled to the first cell by a connection of the first conduction terminals of the first and second transistors of the second cell to the second conduction terminal of the second transistor of the first cell.

7. A voltage gain stage according to claim 6, wherein said first and second transistors are P-channel MOS transistors and the first conduction terminals thereof for the first cell are connected to a ground voltage reference.

8. A voltage gain stage according to claim 6, wherein said first and second transistors are N-channel MOS transistors and the first conduction terminals thereof for the first cell are connected to a main power supply voltage reference.

9. A voltage gain stage according to claim 6, wherein the coupling capacitor of each cell has a smaller capacitance than the pumping capacitor of the same cell.

10. A voltage gain stage according to claim 8, wherein said main power supply is positive voltage.

11. An integrated circuit comprising:

at least one voltage gain stage comprising first, second, third and fourth charge pump cells arranged in a stacked relation;

said first cell receiving first and second clock phase signals;

said second cell receiving third and fourth clock phase signals; and said first and second cells each comprising
first and second transistors each having first and second conduction terminals and a control terminal, said first and second transistors having first conduction terminals connected together, said first and second transistors of the first cell having the first conduction terminals further being connected to a voltage reference, each of the first and second transistors having the control terminal thereof connected to the second conduction terminal of the other transistor of the same cell,
a coupling capacitor connected to the second conduction terminal of the first transistor, the coupling capacitor receiving the first clock phase signal, and
a pumping capacitor connected to the second conduction terminal of the second transistor, the pumping capacitor receiving the second clock phase signal;

said second cell being coupled to said first cell by a connection of the first conduction terminals of the first and second transistors of the second cell to the second conduction terminal of the second transistor of the first cell; and said third and fourth cells each have the same structure as said first and second cells, said third cell being coupled to said first cell by a series connection between corresponding first coupling capacitors and by a series connection between corresponding first pumping capacitors, said fourth cell being coupled to said second cell by a series connection between corresponding coupling capacitors and by a series connection between corresponding pumping capacitors, and said second cell being coupled to said third cell by a connection between the second conduction terminal of the second transistor of said second cell and the first conduction terminals of the first and second transistors of said third cell.

12. An integrated circuit according to claim 11, wherein said first and second transistors are P-channel MOS transistors and the first conduction terminals thereof for the first cell are connected to a ground voltage reference.

13. An integrated circuit according to claim 11, wherein said first and second transistors are N-channel MOS transistors and the first conduction terminals thereof for the first cell are connected to a main power supply voltage reference.

14. An integrated circuit according to claim 11, wherein the coupling capacitor of each cell has a smaller capacitance than the pumping capacitor of the same cell.

15. An integrated circuit according to claim 13, wherein said main power supply is positive voltage.

16. An integrated circuit according to claim 11 further comprising memory cells connected to said at least one voltage gain stage and so that said integrated circuit is a non-volatile memory device.

17. An integrated circuit according to claim 16 wherein said memory cells are Flash EEPROM memory cells.

* * * * *